United States Patent [19]

Selin

[11] Patent Number: 4,656,434
[45] Date of Patent: Apr. 7, 1987

[54] RF POWER AMPLIFIER WITH LOAD MISMATCH COMPENSATION

[75] Inventor: John R. Selin, Stow, Mass.

[73] Assignee: Raytheon Company, Lexington, Mass.

[21] Appl. No.: 825,418

[22] Filed: Feb. 3, 1986

[51] Int. Cl.$^4$ ............................ H03F 3/60; H03F 3/68
[52] U.S. Cl. .......................................... 330/84; 330/53; 330/124 R; 330/149
[58] Field of Search ............... 330/84, 53, 124 R, 149, 330/295; 328/163

[56] References Cited

U.S. PATENT DOCUMENTS

| | | | |
|---|---|---|---|
| 3,202,927 | 8/1965 | Ishimoto et al. | 330/84 |
| 3,371,284 | 2/1968 | Engelbrecht | 330/286 |
| 3,571,739 | 3/1971 | Seidel | 330/4.5 |
| 3,618,126 | 11/1971 | Gerst et al. | 330/53 |
| 3,777,275 | 12/1973 | Cox | 330/10 |
| 3,909,742 | 9/1975 | Cox et al. | 330/84 |
| 3,911,372 | 10/1975 | Seidel | 330/53 |
| 4,053,848 | 10/1977 | Kleische | 330/53 |

FOREIGN PATENT DOCUMENTS 2435708 2/1975 Fed. Rep. of Germany ........ 330/84

Primary Examiner—James B. Mullins
Attorney, Agent, or Firm—Richard M. Sharkansky; Scott W. McLellan; David J. Thibodeau, Jr.

[57] ABSTRACT

An RF power amplifier for delivering power to a load including a first quadrature hybrid coupler driving two class C amplifiers operating with high input compression, a second quadrature hybrid coupler coupled to the outputs of the amplifiers, an attenuator, and a phase shifter. An impedance mismatch by the load causes phase-pulling of the amplifiers which reduces output to the load. This is compensated for by feeding an error signal, indicating the magnitude and phase of the phase-pulling of the two amplifiers, from the second quadrature hybrid coupler through the attenuator and the phase shifter back to the first quadrature hybrid coupler. The attenuated and phase shifted error signal adds to or is subtracted from the input signals to the two amplifiers. Therefore, one of the two amplifiers is driven with more signal and the other amplifier is driven with less signal to phase-push the two amplifiers to compensate for the phase-pulling to thereby increase the output to the load.

5 Claims, 1 Drawing Figure

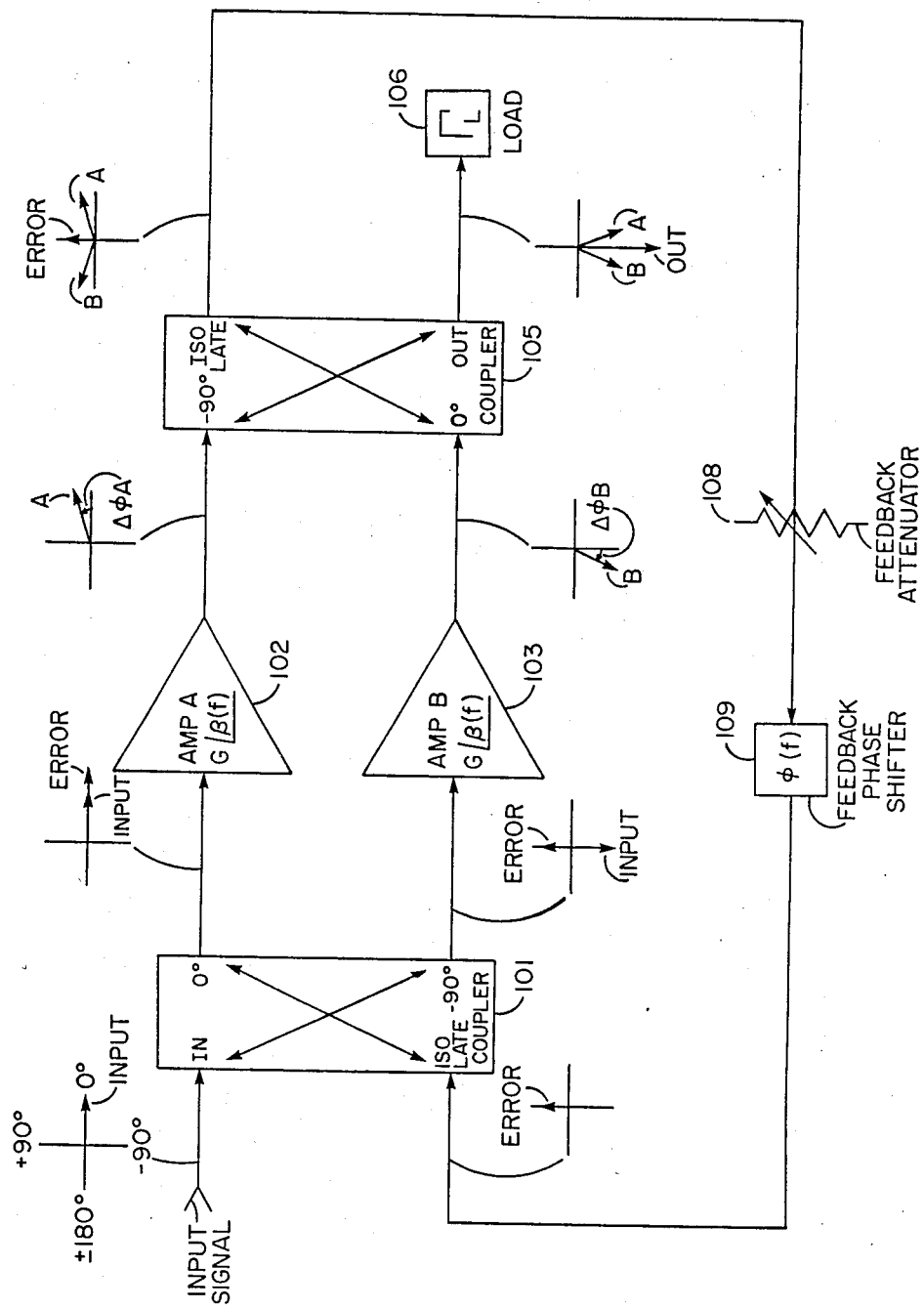

RF POWER AMPLIFIER WITH LOAD MISMATCH COMPENSATION

The Government has rights in this invention pursuant to Contract No. F19628-76-C-0146 awarded by the Department of the Air Force.

BACKGROUND OF THE INVENTION

This invention relates generally to power amplifiers and more particularly to hybrid combining RF power amplifiers.

To meet the high RF output power requirements of radars, communication systems, etc. using transistor amplifiers, one approach to achieve that high power is to combine the output signals of a plurality of lower power transistor amplifiers using a network of quadrature hybrid couplers. An example is shown in FIG. 1 of U.S. Pat. No. 3,371,284 issued to Engelbrecht. Here, a first quadrature hybrid coupler splits an input signal into two signals having equal power in quadrature. These two signals couple to corresponding essentially identical amplifiers. Amplified signals from the output of these amplifiers are recombined by a second quadrature hybrid coupler. The vector components of the amplified signals that are in quadrature are summed to a first output port of the second quadrature hybrid coupler for coupling to an output load. However, the vector components of the amplified signals not in quadrature due to deviation by the amplified signals from quadrature are summed by the second quadrature hybrid coupler to a second output port (isolate) for coupling to a matched terminating load. The deviation from quadrature causes power from the amplifiers to be dissipated in the matched load instead of the output load. A mismatch by the output load presented to the output of the amplifiers by the second quadrature hybrid coupler will force this deviation from quadrature. This deviation from quadrature due to the mismatch to the outputs of the amplifiers is called phase-pulling. With class C type of high efficiency amplifiers, this phase-pulling effect for a given amount of mismatch is greater than with lower efficiency amplifiers, such as class A. To minimize the phase-pulling, the impedance match between the input to the second quadrature hybrid coupler and the output of the amplifiers must be tightly controlled. This impedance match is made very difficult with any output load mismatch. To aggravate matters, the phase-pulling occurs in opposite directions for each amplifier due to the quadrature phase splitting by the second quadrature hybrid coupler on signals reflected from the mismatched load. Use of an isolator at the output port of the second hybrid coupler will protect the amplifier from load mismatches, but an isolator is not perfectly matched itself, having a typical VSWR of 1.25 to 1. Additionally, the second quadrature hybrid coupler itself has a typical VSWR of 1.15 to 1, so that at a particular operating frequency, the combined VSWR of the isolator and second quadrature hybrid coupler would be 1.5 to 1, causing significant loss of the output power from the combined amplifiers to the output load, that loss of power being dissipated in the matched terminated load on the isolate port of the second quadrature hybrid coupler.

SUMMARY OF THE INVENTION

It is therefore an object of this invention to provide an RF power amplifier having means for automatically compensating phase-pulling of the amplifier by an output load mismatch to minimize output power loss due to the phase-pulling.

It is a further object of this invention to provide this automatic compensation over a very wide bandwidth.

This object and other objects of this invention are accomplished generally by feeding back the power normally dissipated in the matched terminated load from the isolate port of the second quadrature hybrid coupler with a predetermined amount of phase shift and attenuation to the isolate port of the first quadrature hybrid coupler. In this way, a first one of the amplifiers is driven with more signal and the second one of the amplifiers is driven with less signal to phase-push the amplifiers to compensate for the phase-pulling effect of the load mismatch to the amplifiers. Additionally, the amount of phase shift of the feedback signal increases with frequency to counteract a phase shift decrease with frequency experienced by the amplifiers and quadrature couplers to allow wideband operation.

BRIEF DESCRIPTION OF THE DRAWINGS

The foregoing features of this invention, as well as the invention itself, may be more fully understood from the following detailed description of the drawings, in which:

The single FIGURE is a diagram of the RF power amplifier with phasor diagrams indicating the operation of the RF power amplifier at different points in the circuit.

DESCRIPTION OF THE PREFERRED EMBODIMENT

The FIGURE diagrams the RF power amplifier. An input signal to be amplified, shown here having 0° relative phase, is applied to quadrature hybrid coupler 101. The 0° output port of hybrid 101 drives amplifier 102 and the −90° (quadrature) output of hybrid 101 drives amplifier 103. Both amplifier 102 and amplifier 103 are class C amplifiers having a gain G and an insertion phase shift $\beta(f)$ which, in general, decreases with frequency and varies with the input signal drive level to the corresponding amplifiers 102, 103. Outputs from amplifiers 102, 103 couple to corresponding ports on quadrature hybrid coupler 105. The vector components of the amplified signals that are in quadrature are summed in phase to the output port for presentation to load 106. As shown in the corresponding phasor diagram, the amplified signal from amplifier 102 is phase shifted −90° by coupler 105 and added to the amplified signal from amplifier 103 for driving the load 106. However, the vector components of the amplified signals that are not in quadrature are summed to the isolate port generating an error signal. As shown in the corresponding phasor diagram, the amplified signal from amplifier 103 is phase shifted by −90° and added to the amplified signal from amplifier 102 to produce the error signal. This error signal is attenuated a predetermined amount by attenuator 108 and phase shifted a predetermined amount by phase shifter 109 for coupling to the isolate port on coupler 101. Shifter 109 provides a predetermined increasing phase shift to counteract the decreasing insertion phase shift of the couplers 101, 105 and amplifiers 102, 103 as the frequency of the input signal increases. The amount of the predetermined phase shift is the amount necessary such that the algebraic sum of the phase shifts in the loop from either of the inputs of amplifier 102 or 103 through coupler 105, attenuator 108, shifter 109 and coupler 101 back to the corresponding input of amplifier 102 or 103, is −90°, with no phase-pulling of amplifiers 102, 103. Should each of the isolate ports on couplers 101, 105 be coupled to a matching termination load (the prior art) and a mismatched load 106 with a non-zero reflection coefficient $\Gamma_L$ is coupled to the output port of coupler 105, a load impedance mismatch is presented to the outputs of amplifiers 102, 103 via coupler 105. This mismatch causes a phase shift, called phase-pulling, in the output signals from amplifiers 102, 103 as shown in the phasor diagram corresponding to each output of the amplifiers 102, 103. It is noted that the phasor diagrams neglect the insertion phase shift $\beta(f)$ of the amplifiers 102, 103. Due to the quadrature phase splitting effect of the hybrid coupler 105, the phase-pulling effect on the amplifiers 102, 103 occurs in opposite directions, i.e., one amplifier has its phase-pulled leading and the other amplifier has its phase-pulled lagging. This causes the output power delivered to the load 106 to decrease by:

$$\frac{\text{Power out phase-pulled}}{\text{Power out matched}} = \cos^2\left[\frac{\Delta\phi A - \Delta\phi B}{2}\right]$$

where $\Delta\phi A$ is the angle of phase-pulling of amplifier 102 and $\Delta\phi B$ is the angle of phase-pulling of amplifier 103. As shown in the FIGURE, amplifier 102 is phase-pulled leading by $\Delta\phi A$ and amplifier 103 is phase-pulled lagging by $\Delta\phi B$. For example, if load reflection coefficient $\Gamma_L=0.2$ for load 106, corresponding to a 1.5 to 1 VSWR, typical values are $\Delta\phi A = 25°$ and $\Delta\phi B = -25°$. This results in the output power available to the output port of coupler 105 to be reduced by a factor of 0.82, or −0.85 dB. The power not available on the output port of coupler 105 is transferred to the isolate port of the coupler 105, wherein the prior art the power would be dissipated in the matched termination load. It is noted that the signal occurring at the isolate port of the quadrature hybrid coupler 105 indicates the magnitude of the phase imbalance and which of the amplifiers 102, 103 has the leading insertion phase and which has the lagging insertion phase. It is further noted that the insertion phase $\beta(f)$ of class C amplifiers, operating with high input compression, can be changed by varying the input signal level to that amplifier. Such an effect is called phase-pushing. By feeding the error signal on the isolate port of coupler 105 back to the isolate port of coupler 101 with the correct phase and amplitude, the amplitude of the input signals to amplifiers 102, 103 can be adjusted as shown by the phase diagrams for the inputs to amplifiers 102, 103. These amplitude variations phase-push the amplifiers 102, 103 to compensate for the phase-pull caused by the load mismatch. As shown in the FIGURE, the error signal at the isolate port of coupler 105 passes through attenuator 108 and phase shifter 109. It is noted that for clarity the phase shift caused by phase shifter 109 is neglected in the phasor diagrams. The error signal from phase shifter 109 is then applied to the isolate port of coupler 101 such that the amplifier having its output phase phase-pulled leading (amplifier 102) has the amplitude of the input signal increased by the phase-shifted error signal and the amplifier having its output phase phase-pulled lagging (amplifier 103) has the amplitude of the input signal decreased by the phase-shifted error signal. This causes the leading phase-pulled amplifier (amplifier 102) to have its output phase phase-pushed back toward 0° and the lagging phase-pulled amplifier (amplifier 103) to have its output phase phase-pushed back toward −90°. The amount of the phase-pulling after correction, $\Delta\phi f$, divided by the amount of phase-pulling without correction, $\Delta\phi$ (which is essentially equal to $\Delta\phi A$ or $\Delta\phi B$) is a phase compensation factor, $\gamma$:

$$\gamma = \frac{\Delta\phi f}{\Delta\phi} = \frac{1}{1 + (\beta' G)/\alpha}$$

where $\beta'$ is the magnitude of the phase-pushing factor (the derivative of $\beta(f)$ for amplifiers 102, 103) in radians, G is the gain of the amplifiers 102, 103 and $\alpha$ is the voltage attenuation ratio of attenuator 108.

Rewriting the above equation to use more familiar units:

$$\gamma = \frac{1}{1 + \beta'(0.143)[10^{(G-\alpha)/20}]}$$

where $\beta'$ is in degrees per dB, and G and $\alpha$ are in dB. Therefore, the increase in output power at the output port of combiner 105 due to phase-pulling correction can be expressed:

$$\Delta P(\text{dB}) = 20 \log \left[\frac{\cos\left[\gamma \frac{(\Delta\phi A - \Delta\phi B)}{2}\right]}{\cos\left[\frac{\Delta\phi A - \Delta\phi B}{2}\right]}\right]$$

Using the above example of $\Delta\phi A = 25°$ and $\Delta\phi B = -25°$, and using $\beta' = 10°/\text{dB}$ and $G = \alpha = 10$ dB, $\gamma = 0.41$, the resulting loss is 0.85 dB without feedback and the power increase, $\Delta P$, is 0.71 dB. Thus, the residual phase-pulling loss is only 0.14 dB.

Having described a preferred embodiment of this invention, it will now be apparent to one of skill in the art that other embodiments incorporating its concept may be used. It is felt, therefore, that this invention should not be limited to the disclosed embodiment, but rather should be limited only by the spirit and scope of the appended claims.

What is claimed is:

1. An amplifying apparatus for RF signals applied to a mismatched output load, such amplifying apparatus being compensated for output signal level reduction due to the output load mismatch and comprising:
    a first quadrature coupling means having an input port to which RF signals to be amplified are applied, an isolate port, a 0° output port, and a −90° output port, for coupling the RF signals in quadrature to the 0° and −90° output ports and coupling signals from the isolate port in quadrature to the 0° and −90° output ports, wherein corresponding signals on the input port and the −90° output port are in quadrature, and corresponding signals on the isolate port and the 0° output port are in quadrature;
    a first amplifying means, having a gain G and an insertion phase $\beta(f)$, for amplifying signals from the 0° output port;
    a second amplifying means, having essentially the same gain and insertion phase as the first amplifying means, for amplifying signals from the −90° output port;

a second quadrature coupling means having a 0° input port, a −90° input port, an output port, and an isolate port, the −90° input port coupled to the output of the first amplifying means, the 0° input port coupled to the output of the second amplifying means, the output port coupling to the mismatched output load, for combining in quadrature signals from the 0° and −90° input ports to the output port and combining in quadrature signals from the 0° and −90° input ports to the isolate port, wherein corresponding signals signals on the −90° input port and the output port are in quadrature and corresponding signals on the 0° input port and the isolate port are in quadrature;

an attenuator coupled to the isolate port of the second quadrature coupling means; and means for phase shifting a signal from the attenuator to the isolate port of the first quadrature hybrid coupler, to null the phase shift of the signal out of each one of the first and second amplifying means.

2. The amplifying apparatus as recited in claim 1 wherein the first and second amplifying means each comprise a class C amplifier operating with high input compression.

3. The amplifying apparatus as recited in claim 2, wherein the means for phase shifting further comprises a means for increasing the phase shift with increasing frequency, wherein the amount of increase of phase shift with increasing frequency matches the insertion phase shift decrease with increasing frequency of the first and second amplifying means and the first and second quadrature hybrid combiners.

4. An apparatus for amplifying a radio frequency signal applied to a mismatched output load, comprising:

first quadrature coupling means having an input port connected to receive the radio frequency signal to be amplified, an isolate port, a 0° output port, and a −90° output port, for coupling the radio frequency signal in quadrature to the 0° and −90° output ports and for coupling signals from the isolate port in quadrature to the 0° and −90° output ports, wherein corresponding signals on the input port and the −90° output port are in quadrature, and corresponding signals on the isolate port and the 0° output port are in quadrature;

first amplifying means, having a gain G and an insertion phase $\beta(f)$, for amplifying signals from the 0° output port;

second amplifying means, having essentially the same gain and insertion phase as the first amplifying means, for amplifying signals from the −90° output port;

second quadrature coupling means, having a 0° input port, a −90° input port, an output port, and an isolate port, the −90° input port coupled to the output of the first amplifying means, the 0° input port coupled to the output of the second amplifying means, the output port coupling to the mismatched output load, for combining in quadrature signals from the 0° and −90° input ports to the output port and combining in quadrature signals from the 0° and −90° input ports to the isolate port, wherein corresponding signals on the −90° input port and the output port are in quadrature and corresponding signals on the 0° input port and the isolate port are in quadrature; and means for phase-pushing, having an input coupled to the isolate port of the second quadrature coupling means and an output coupled to the isolate port of the first quadrature coupling means, for compensating for the phase-pulling effect of the load mismatch to the amplifiers.

5. Apparatus as in claim 4 wherein the first and second amplifying means and the first and second quadrature coupling means exhibit an insertion phase decrease as the radio frequency signal increases in frequency, and the means for phase-pushing further comprises:

means for increasing phase shift as the frequency of the radio frequency signal increases, such that the amount of increasing phase shift equals the insertion phase shift decrease of the first and second amplifying means and the first and second quadrature coupling means.

* * * * *